(12) United States Patent
Iwanami et al.

(10) Patent No.: US 8,941,402 B2
(45) Date of Patent: Jan. 27, 2015

(54) ELECTROMAGNETIC FIELD MEASURING APPARATUS, ELECTROMAGNETIC FIELD MEASURING METHOD USED FOR THE SAME, AND NON-TRANSITORY COMPUTER READABLE MEDIUM STORING ELECTROMAGNETIC FIELD MEASUREMENT CONTROL PROGRAM

(75) Inventors: Mizuki Iwanami, Tokyo (JP); Hiroshi Fukuda, Tokyo (JP); Risato Ohhira, Tokyo (JP)

(73) Assignee: NEC Corporation, Tokyo (JP)

( * ) Notice: Subject to any disclaimer, the term of this patent is extended or adjusted under 35 U.S.C. 154(b) by 375 days.

(21) Appl. No.: 13/382,503

(22) PCT Filed: May 18, 2010

(86) PCT No.: PCT/JP2010/003351
§ 371 (c)(1),
(2), (4) Date: Jan. 5, 2012

(87) PCT Pub. No.: WO2001/004536
PCT Pub. Date: Jan. 13, 2011

(65) Prior Publication Data
US 2012/0098560 A1    Apr. 26, 2012

(30) Foreign Application Priority Data
Jul. 10, 2009    (JP) .................... 2009-164055

(51) Int. Cl.
*G01R 31/302* (2006.01)
*G01R 31/311* (2006.01)
*G01R 15/24* (2006.01)

(52) U.S. Cl.
CPC ............ *G01R 31/311* (2013.01); *G01R 15/245* (2013.01)

USPC ............. 324/754.31; 324/76.12; 324/73.13; 324/76.19; 324/76.22; 324/76.36; 338/174; 318/16; 318/618; 350/171

(58) Field of Classification Search
USPC ........ 324/754.31, 76.12, 76.13, 76.19, 76.22, 324/76.36; 338/174; 318/16, 618; 350/171
See application file for complete search history.

(56) References Cited

U.S. PATENT DOCUMENTS 2,899,548 A * 8/1959 Boughtwood ................. 375/267
(Continued)

FOREIGN PATENT DOCUMENTS

CN    101213462 A    7/2008
JP    2008-020304 A    1/2008

OTHER PUBLICATIONS

S. Wakana, et al., "Fiber-Edge Electrooptic/Magnetooptic Probe for Spectral Domain Analysis of Electromagnetic Field", IEEE Trans. Microwave Theory Tech., vol. 48, No. 12, pp. 2611-2616, 2000.

(Continued)

*Primary Examiner* — Huy Q Phan
*Assistant Examiner* — Temilade S Rhodes-Vivour
(74) *Attorney, Agent, or Firm* — McGinn IP Law Group, PLLC

(57) ABSTRACT

An electromagnetic field measuring apparatus capable of measuring an electromagnetic field for a minuscule area in which electronic devices are densely packed with a high sensitivity is provided. In an electromagnetic field measuring apparatus according to the present invention, the amplitude level of signal light (pf) is adjusted by the analyzer (34) by adjusting its angle with respect to the plane of polarization of the signal light (pf) based on an amplitude level control signal (eb) supplied from the calculation control unit (40). An amplitude level control signal (eb) is supplied from the calculation control unit (40) to the analyzer (34) based on the spectrum (ea) of an electric signal (ed) measured by an RF spectrum analyzer (39). The amplitude level ration between the carrier and the sideband contained in the signal light (ph) incident on the optical receiver (38) is controlled to a fixed value.

26 Claims, 11 Drawing Sheets

(56) References Cited

U.S. PATENT DOCUMENTS

| | | | | |
|---|---|---|---|---|
| 3,740,627 | A | * | 6/1973 | Martin et al. .................. 318/16 |
| 3,741,742 | A | * | 6/1973 | Jennings ...................... 65/29.16 |
| 4,416,512 | A | * | 11/1983 | Sinclair ......................... 359/629 |
| 4,504,921 | A | * | 3/1985 | Nasuta et al. ................ 359/259 |
| 4,888,611 | A | * | 12/1989 | Smallwood, II ............... 355/32 |
| 5,696,372 | A | * | 12/1997 | Grober et al. ................ 250/216 |
| 8,153,955 | B2 | | 4/2012 | Nakada et al. |
| 8,519,323 | B2 | | 8/2013 | Nakada et al. |
| 2005/0169402 | A1 | * | 8/2005 | Niwa et al. .................... 375/298 |
| 2006/0212555 | A1 | * | 9/2006 | Harada ......................... 709/223 |
| 2008/0054880 | A1 | * | 3/2008 | Miyauchi et al. .......... 324/76.29 |
| 2010/0327940 | A1 | * | 12/2010 | Eisenstadt et al. ........... 327/357 |

OTHER PUBLICATIONS

S. Wakana, et al., "Perfomance Evaluation of Fiber-Edge Magnetooptic Probe", J. Lightwave Technol., vol. 21, No. 12, pp. 3292-3299, 2003.

K. Sasagawa, et al.,"Live Electrooptic Imaging System Based on Ultraparallel Photonic Heterodyne for Microwave Near-Fields" IEEE Trans. Microwave Theory Tech., vol. 21, No. 12, pp. 2782-2791, 2007.

M. Iwanami, M. Nakada, T. Tsukagoshi, H. Tsuda, K. Ohashi, J. Akedo, T. Harada, "High Frequency Electric Field/Magnetic Field Measurements by Fiber-Optic Electooptic/Magnetooptic Probe", 2007 Nen Proceedings of the Society Conference of IEICE, Aug. 29, 2007 Tsushin(1), BS-3-3, pp. S-31 to S-32.

Mizuki Iwanami "Electromagnetic Near-Field Measurement Technique toward High Speed, Densely Packed Circuits Deisgns", Journal of Japan Institute of Electronics Packaging, May 1, 2007, vol. 10, No. 3, pp. 185 to 189

Masafumi Nakada, Keishi Ohashi, "Ultra-small High Speed Optical Devices with Transparent Functional Thin Films", Ceramic, Sep. 1, 2008, vol. 43, No. 9, pp. 722-725.

International Search Report in PCT/JP/2010/003351 Aug. 17. 2010 dated (English Translation Thereof).

Chinese Office Action dated Sep. 27, 2013, with English translation.

* cited by examiner

ELECTROMAGNETIC FIELD MEASURING APPARATUS, ELECTROMAGNETIC FIELD MEASURING METHOD USED FOR THE SAME, AND NON-TRANSITORY COMPUTER READABLE MEDIUM STORING ELECTROMAGNETIC FIELD MEASUREMENT CONTROL PROGRAM

TECHNICAL FIELD

The present invention relates to an electromagnetic field measuring apparatus, an electromagnetic field measuring method used for that electromagnetic field measuring apparatus, and a non-transitory computer readable medium storing an electromagnetic field measurement control program. For example, the present invention relates to an electromagnetic field measuring apparatus, an electromagnetic field measuring method used for that electromagnetic field measuring apparatus, and a non-transitory computer readable medium storing an electromagnetic field measurement control program that are applied to and suitable for cases where an electric field and a magnetic field are measured in the vicinity of an electronic circuit or component in which electronic devices are densely packed such as on an LSI (Large Scale Integrated circuit) and an LSI package.

BACKGROUND ART

When the operation of an electronic circuit or component in which electronic devices are densely packed such as on an LSI (Large Scale Integrated circuit) and an LSI package is verified, an electromagnetic field measuring apparatus is used to measure an electric field and a magnetic field in the vicinity of the circuit or component. The electromagnetic field measuring apparatus measures an electric field or a magnetic field in the vicinity of an object to be measured by using a laser beam and an electro-optic (EO) material or a magneto-optic (MO) material. Examples of the related art of this kind include apparatuses disclosed in Non-patent literatures 1, 2 and 3. These literatures disclose reports on evaluation results of microwave circuits and antennas obtained by using electromagnetic field measuring apparatuses. The electromagnetic field measuring apparatus includes an optical measuring device including a laser light source, and an electromagnetic field sensor made of EO/MO material. In the electromagnetic field measuring apparatus, a laser beam is launched into the EO/MO material (electromagnetic field sensor) and changes in the refractive index of the EO/MO material according to the nearby electromagnetic field strength are detected. By doing so, an electric field and a magnetic field are measured.

Further, the electromagnetic field measuring apparatus of this kind includes, in addition to the configuration in which light emitted from a laser light source propagates through the space and enters the EO/MO material, another configuration in which the optical measuring device and the EO/MO material are entirely connected through an optical fiber(s) so that a laser beam propagates through the optical fiber and enters the EO/MO material. In the electromagnetic field measuring apparatus, it is possible to carry out a measurement with a high spatial resolution in a minuscule area by carrying out micromachining on the EO/MO material. Therefore, it has been expected that the electromagnetic field measuring apparatus will exhibit its ability in performance evaluations, fault diagnoses, or electric designing of densely-packed electronic circuits and components.

For example, as shown in FIG. 11, an electromagnetic field measuring apparatus disclosed in Non-patent literature 1 includes a laser light source 1, an optical fiber 2, a light amplifier 3, an optical fiber 4, a polarization controller 5, an optical fiber 6, an optical circulator 7, an optical fiber 8, an EO/MO crystal 9, an optical fiber 10, an analyzer 11, an optical fiber 12, a light amplifier 13, an optical fiber 14, a optical receiver 15, and an RF (Radio Frequency) spectrum analyzer 16. Each of the light amplifiers 3 and 13 is composed of, for example, an EDFA (Erbium-Doped Fiber Amplifier). Further, a circuit to be measured TS, i.e., a circuit whose operation is to be verified, is disposed near the above-mentioned EO/MO crystal 9.

In this electromagnetic field measuring apparatus, carrier (carrier wave) signal light pa having a frequency $f_{OF}$ is emitted from the laser light source 1. The carrier signal light pa enters the light amplifier 3 through the optical fiber 2. Then, the carrier signal light pa is amplified in the light amplifier 3 and emitted as signal light pb. The signal light pb enters the polarization controller 5 through the optical fiber 4. Then, the signal light pb is adjusted in polarization in the polarization controller 5 and emitted as signal light pc. The signal light pc propagates through the optical fiber 6, the optical circulator 7, and the optical fiber 8, enters the EO/MO crystal 9 as signal light pd, and returns to the optical fiber 8 again as signal light pe. In this point, the signal light pe is modulated due to the electromagnetic field (frequency $f_{RF}$) caused by the circuit to be measured TS.

As a result of this modulation, the signal light pe has such a spectrum that sideband peaks (an upper-side wave having a frequency $[f_{OF}+f_{RF}]$ and a lower-side wave having a frequency $[f_{OF}-f_{RF}]$ appear on both sides of the carrier signal (frequency $f_{OF}$). The signal light pe enters the analyzer 11 through the optical fiber 8, the optical circulator 7, and the optical fiber 10, and is emitted as signal light pg. The signal light pg enters the light amplifier 13 through the optical fiber 12. Then, the signal light pg is amplified in the light amplifier 13 in order to improve the sensitivity to the optical receiver 15 and emitted as signal light ph. In this process, when the level of the carrier signal is high, the amplification factor of the sideband becomes lower because of the saturation characteristic of the light amplifier 13 (that is, when the level of the carrier signal is high, the sideband cannot be sufficiently amplified). Therefore, the level of the carrier signal is attenuated to some extent by the analyzer 11 according to the saturation characteristic of the light amplifier 13. The signal light ph is input to the optical receiver 15 and converted into an electric signal ed. This electric signal ed has a frequency $f_{RF}$. The electric signal ed is input to the RF spectrum analyzer 16, and the spectrum of the electromagnetic field (frequency $f_{RF}$) caused by the circuit to be measured TS is analyzed.

Further, a magnetic field measuring apparatus disclosed in Non-patent literature 2 has a similar configuration and operates in a similar manner to the above-described electromagnetic field measuring apparatus disclosed in Non-patent literature 1, though it is specialized to the measurement of magnetic fields.

Further, in an electromagnetic field measuring apparatus disclosed in Non-patent literature 3, a light modulator is introduced and the frequencies of electromagnetic waves to be measured are down-converted by this light modulator.

CITATION LIST

Non Patent Literature

NPL 1: S. Wakana, et al., "Fiber-Edge Electrooptic/Magnetooptic Probe for Spec tral-Domain Analysis of Electromagnetic Field", IEEE Trans. Microwave Theory Tech., vol. 48, no. 12, pp. 2611-2616, 2000.

NPL 2: S. Wakana, et al., "Performance Evaluation of Fiber-Edge Magnetooptic Probe", J. Lightwave Technol., vol. 21, no. 12, pp. 3292-3299, 2003.

NPL 3: K. Sasagawa, et al., "Live Electrooptic Imaging System Based on Ultraparallel Photonic Heterodyne for Microwave Near-Fields", IEEE Trans. Microwave Theory Tech., vol. 55, no. 12, pp. 2782-2791, 2007.

SUMMARY OF INVENTION

Technical Problem

However, the following problem exists in the above-described related art. That is, in the electromagnetic field measuring apparatus shown in FIG. 11, the signal light ph enters the optical receiver 15 and is converted into the electric signal ed. However, the level of the electric signal ed, i.e., the signal level that is ultimately detected by the RF spectrum analyzer 16 is maximized in a state where the level ratio between the carrier (carrier wave) and the sideband (side wave) becomes 4:1 as expressed in power (2:1 as expressed in voltage). Therefore, if the signal light ph incident on the optical receiver 15 can be put into this state, the electromagnetic field caused by the circuit to be measured TS is detected with a high sensitivity. However, this apparatus does not have any function of controlling the level ratio between the carrier and the sideband because the electric signal ed output from the optical receiver 15 has the frequency $f_{RF}$. Therefore, this electromagnetic field measuring apparatus has a problem that it is not satisfactory when, for example, an electromagnetic field needs to be measured with a high sensitivity for a minuscule area in which electronic devices are densely packed.

Further, the magnetic field measuring apparatus disclosed in Non-patent literature 2 has substantially the same problem as that of the electromagnetic field measuring apparatus shown in FIG. 11. Further, the electromagnetic field measuring apparatus disclosed in Non-patent literature 3 has a different configuration from that of the present invention because the frequency of the electromagnetic wave to be measured is down-converted by the light modulator.

The present invention has been made in view of the above-described circumstances, and an object thereof is to provide an electromagnetic field measuring apparatus capable of measuring an electromagnetic field for a minuscule area or the like in which electronic devices are densely packed with a high sensitivity, an electromagnetic field measuring method used for that electromagnetic field measuring apparatus, and a non-transitory computer readable medium storing an electromagnetic field measurement control program.

Solution to Problem

To solve the above-mentioned problem, a first configuration according to the invention relates to an electromagnetic field measuring apparatus and includes: a laser light source that emits a laser beam having a predetermined frequency as carrier signal light; light modulation means for generating modulated light by modulating the carrier signal light at a predetermined local oscillation frequency, and emitting the modulated light; a certain optical component; an electromagnetic field sensor that generates signal light by exposing the modulated light incident through the optical component to an electromagnetic field of a radio frequency band caused by an object to be measured and thereby modulating the modulated light, and emits the signal light; a opticel receiver that receives the signal light from the electromagnetic field sensor through the optical component and outputs an electric signal having a same radio frequency as the electromagnetic field; a spectrum analyzer that measures a spectrum of the electric signal; and amplitude level ratio control means for controlling an amplitude level ratio between a carrier and a sideband contained in the signal light incident on the opticel receiver to a fixed value based on the spectrum of the electric signal measured by the spectrum analyzer.

A second configuration according to the invention relates to an electromagnetic field measuring method and includes: a carrier signal light emitting process of emitting a laser beam having a predetermined frequency as carrier signal light; a modulated light emitting process of generating modulated light by modulating the carrier signal light at a predetermined local oscillation frequency, and emitting the modulated light; a signal light emitting process of generating signal light by exposing the modulated light incident through a certain optical component to an electromagnetic field of a radio frequency band caused by an object to be measured and thereby modulating the modulated light, and emitting the signal light; an electric signal output process of outputting an electric signal having a same radio frequency band as the electromagnetic field based on the signal light incident through the optical component; a spectrum measurement process of measuring a spectrum of the electric signal; and an amplitude level ratio control process of controlling an amplitude level ratio between a carrier and a sideband contained in the signal light incident through the optical component to a fixed value based on the spectrum of the electric signal measured in the spectrum measurement process.

Advantageous Effects of Invention

According to the configuration of the invention, it is possible to measure an electromagnetic field caused by an object to be measured with a high sensitivity.

DESCRIPTION OF EMBODIMENTS

Figure 1:
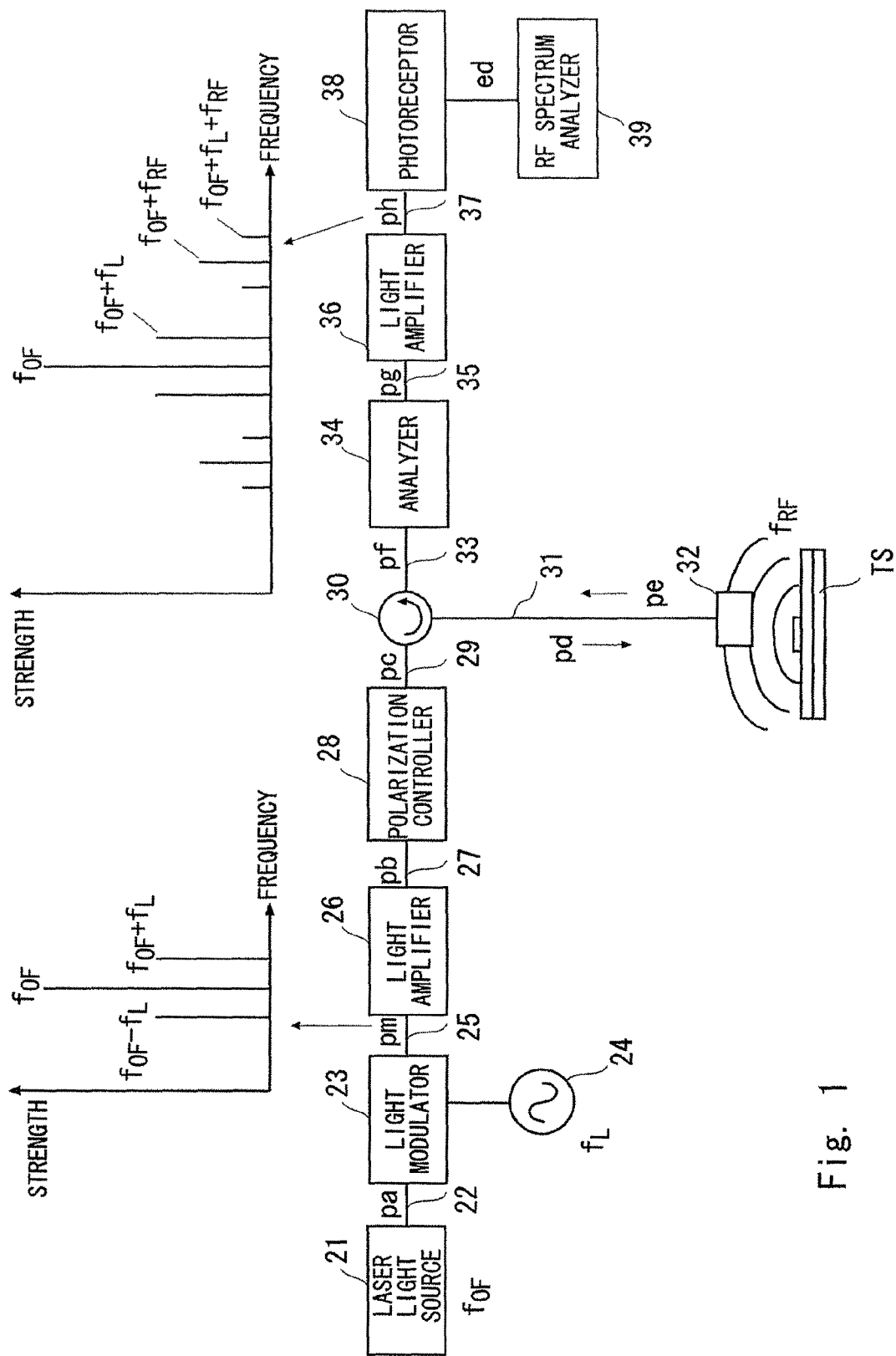
FIG. 1 schematically shows a configuration of an electromagnetic field measuring apparatus and a light spectrum of each component for explaining the basic principle of the invention.

An electromagnetic field measuring apparatus in which the aforementioned amplitude level ratio control means is used as a configuration to adjust the amplitude level of the aforementioned carrier is provided.

Further, in a preferred embodiment according to the invention, the aforementioned optical component includes plane of polarization adjustment means for adjusting a plane of polarization of the aforementioned modulated light emitted from the aforementioned light modulation means to a predetermined direction. Further, the aforementioned amplitude level ratio control means includes a calculation control unit that outputs an amplitude level control signal based on the spectrum of the aforementioned electric signal measured by the aforementioned spectrum analyzer, and an analyzer that adjusts the amplitude level of the aforementioned carrier by adjusting its angle with respect to the plane of polarization of the aforementioned carrier based on the aforementioned amplitude level control signal.

Further, in a preferred embodiment according to the invention, the aforementioned amplitude level ratio control means includes an optical coupler that generates branched modulated light by causing the aforementioned modulated light incident on the aforementioned electromagnetic field sensor to branch and emits the branched modulated light, and lets signal light emitted from the aforementioned electromagnetic field sensor to pass therethrough, a calculation control unit that outputs an amplitude level control signal based on the spectrum of the aforementioned electric signal measured by the aforementioned spectrum analyzer, a voltage generator that generates a control voltage based on the aforementioned amplitude level control signal, and a piezoelectric element that generates amplitude level adjustment modulated light by adjusting the phase of the aforementioned branched modulated light emitted from the optical coupler based on the aforementioned control voltage, and emits the amplitude level adjustment modulated light to the aforementioned optical coupler and thereby combines the amplitude level adjustment modulated light with the aforementioned signal light.

Further, in a preferred embodiment according to the invention, the aforementioned amplitude level ratio control means includes a first optical coupler that generates branched modulated light by causing the aforementioned modulated light incident through the aforementioned optical component to branch, and emits the branched modulated light, a calculation control unit that outputs an amplitude level control signal based on the spectrum of the aforementioned electric signal measured by the aforementioned spectrum analyzer, a voltage generator that generates a control voltage based on the aforementioned amplitude level control signal, a light modulation element that generates amplitude level adjustment modulated light by adjusting the phase of the aforementioned branched modulated light emitted from the first optical coupler based on the aforementioned control voltage, and emits the amplitude level adjustment modulated light, and a second optical coupler that combines the aforementioned amplitude level adjustment modulated light emitted from the light modulation element with the aforementioned signal light emitted from the aforementioned electromagnetic field sensor.

Further, in a preferred embodiment according to the invention, the aforementioned laser light source is configured to output a reference signal indicating the frequency, the phase, and the amplitude of the aforementioned carrier signal light. Further, the aforementioned amplitude level ratio control means includes a calculation control unit that outputs the aforementioned amplitude level control signal based on the spectrum of the aforementioned electric signal measured by the aforementioned spectrum analyzer, an amplitude level adjustment laser light source that emits an amplitude level adjustment laser beam having the same frequency and the same amplitude as those of the aforementioned carrier signal light, and having a phase according to the amplitude level control signal, based on the aforementioned reference signal, and an optical coupler that combines the aforementioned amplitude level adjustment laser beam with the aforementioned signal light emitted from the aforementioned electromagnetic field sensor.

Further, in a preferred embodiment according to the invention, the aforementioned amplitude level ratio control means is configured to control the aforementioned amplitude level ratio between the carrier and the sideband to 4:1. Further, in a preferred embodiment according to the invention, the aforementioned amplitude level ratio control means is configured to control the amplitude level ratio between the carrier and the sideband contained in the aforementioned signal light incident on the aforementioned opticel receiver to a fixed value based on the spectrum corresponding to the aforementioned local oscillation frequency and a frequency obtained by adding the radio frequency band of the aforementioned electromagnetic field to that local oscillation frequency among the spectrums of the aforementioned electric signal measured by the aforementioned spectrum analyzer.

FIG. 1 schematically shows a configuration of an electromagnetic field measuring apparatus and a light spectrum of each component for explaining the basic principle of the invention. As shown in FIG. 1, this electromagnetic field measuring apparatus includes a laser light source 21, an optical fiber 22, a light modulator 23, a local oscillator 24, an optical fiber 25, a light amplifier 26, an optical fiber 27, a polarization controller 28, an optical fiber 29, an optical circulator 30, an optical fiber 31, an EO/MO crystal 32, an optical fiber 33, an analyzer 34, an optical fiber 35, a light amplifier 36, an optical fiber 37, an optical receiver 38, and an RF spectrum analyzer 39.

The laser light source 21 emits laser beam having a frequency $f_{OF}$ to the optical fiber 22 as carrier signal light pa. The light modulator 23, which is composed of, for example, a Mach-Zehnder type light modulator, modulates the carrier signal light pa incident through the optical fiber 22 at the local oscillation frequency of the local oscillator 24 and emits the modulated signal light to the optical fiber 25 as modulated light pm. The light amplifier 26, which is composed of, for example, an EDFA, amplifies the modulated light pm incident through the optical fiber 25 and emits the amplified modulated light to the optical fiber 27 as signal light pb. The polarization controller 28 adjusts the plane of polarization of the signal light pb incident through the optical fiber 27 to a predetermined direction and emits the adjusted signal light to the optical fiber 29 as signal light pc. The optical circulator 30 emits the signal light pc incident through the optical fiber 29 to the optical fiber 31 as signal light pd.

The EO/MO crystal 32, which is formed by stacking an electrooptic material layer and a magnetooptic material layer on top of one another, receives the signal light pd through the optical fiber 31, modulates the signal light pd by exposing it to an electromagnetic field (frequency $f_{RF}$) caused by an object to be measured TS whose operation is to be verified, and emits the modulated signal light to the optical fiber 31 as signal light pe. Further, the optical circulator 30 emits the signal light pe incident through the optical fiber 31 to the optical fiber 33 as signal light pf. The analyzer 34 adjusts the amplitude level of the signal light pe incident through the optical fiber 33 by adjusting its angle with respect to the plane of polarization of the signal light pe, and emits the adjusted signal light to the optical fiber 35 as signal light pg. Similarly to the light amplifier 26, the light amplifier 36, which is composed of, for example, an EDFA, amplifies the signal light pg incident through the optical fiber 35 in order to improve the sensitivity to the optical receiver 38, and emits the amplified signal light to the optical fiber 37 as signal light ph. The optical receiver 38 receives the signal light ph and outputs an electric signal ed having the same radio frequency band as the electromagnetic field (frequency $f_{RF}$). The RF spectrum analyzer 39 measures the spectrum of the electric signal ed.

In this electromagnetic field measuring apparatus, a laser beam having a frequency $f_{OF}$ is emitted by the laser light source 21 as carrier signal light pa (carrier signal light emitting process), and the carrier signal light pa is modulated at the local oscillation frequency of the local oscillator 24 by the light modulator 23 and emitted as modulated light pm (modulated light emitting process). The modulated light pm is amplified by the light amplifier 26 and emitted as signal light pb. Further, the plane of polarization of the signal light pb is adjusted by the polarization controller 28 and the adjusted signal light is emitted as signal light pc. The signal light pc is emitted through the optical circulator 30 as signal light pd, and the signal light pd enters the EO/MO crystal 32. The signal light pd is modulated by the EO/MO crystal 32 and the modulated signal light is emitted as signal light pe (signal light emitting process). The amplitude level of the signal light pe is adjusted by the analyzer 34, and the adjusted signal light is emitted as signal light pg. Further, the signal light pg is amplified and the amplified signal light is emitted as signal light ph.

The signal light ph enters the optical receiver 38 and is output as an electric signal ed by the optical receiver 38 (electric signal output process), and the spectrum of the electric signal ed is measured by the RF spectrum analyzer 39 (spectrum measurement process). The amplitude level ratio between the carrier and the sideband contained in the signal light ph incident on the optical receiver 38 is controlled to a fixed value based on the spectrum of the electric signal ed measured by the RF spectrum analyzer 39, by amplitude level ratio control means (not shown) (amplitude level ratio control process). In this amplitude level ratio control process, the amplitude level of the carrier is adjusted by the amplitude level ratio control means.

In particular, in this amplitude level ratio control process, the amplitude level ratio between the carrier and the sideband is control to 4:1 by the amplitude level ratio control means. In this case, in the amplitude level ratio control process, the amplitude level ratio between the carrier and the sideband contained in the signal light ph incident on the optical receiver 38 is control to a fixed value (4:1) based on the spectrum corresponding to the local oscillation frequency and a frequency obtained by adding the radio frequency band (frequency $f_{RF}$) of the electromagnetic field to the local oscillation frequency among the spectrums of the electric signal ed measured by the RF spectrum analyzer 39, by the amplitude level ratio control means.

That is, in this electromagnetic field measuring apparatus, the carrier (carrier wave) signal light pa having a frequency $f_{OF}$ emitted from the laser light source 21 is modulated by the light modulator 23 and thereby becomes the modulated light pm. In this modulated light pm, sideband peaks appear at frequencies away from the frequency $f_{OF}$ by a frequency $f_L$ on the lower frequency side and the higher frequency side, i.e., at frequencies $[f_{OF}+f_L]$ and $[f_{OF}-f_L]$. The light containing these peaks is further modulated in the EO/MO crystal 32, which is exposed in an electromagnetic field having a frequency $f_{RF}$, and therefore additional sideband peaks appear around the carrier (frequency $f_{OF}$) and around each of the sidebands generated by the modulator 23 (e.g., frequency $[f_{OF}+f_{RF}]$ and frequency $[f_{OF}+f_L+f_{RF}]$). As a result, the spectrum of the signal light ph immediately before entering the optical receiver 38 becomes, for example, the one shown in FIG. 1.

While referring to this spectrum, firstly, assume that the light modulator 23 does not exist. Then, in the spectrum of the signal light ph, peaks exist only at the frequency $f_{OF}$ and at the frequencies $[f_{OF}\pm f_{RF}]$. In this case, the frequency of the electric signal ed detected by the RF spectrum analyzer 39 after the optical/electrical conversion performed by the optical receiver 38 is the frequency $f_{RF}$ alone. Therefore, it is impossible to measure the strength ratio between the peak of the carrier and the peak of the sideband in this configuration.

In contrast to this, when the light modulator 23 exists, a lot of peaks appear in the spectrum of the signal light ph. When attention is given to peaks at frequencies $[f_{OF}+f_L]$ and $[f_{OF}+f_L+f_{RF}]$ among these peaks, the peak at the frequency $[f_{OF}+f_L]$ is generated by the light modulator 23 and the peak at the frequency $[f_{OF}+f_L+f_{RF}]$ is generated by the fact that the light generated by the light modulator 23 is further modulated by the electromagnetic field caused by the circuit to be measured TS.

The strength ratio between them is equal to the strength ratio between the carrier and the sideband located at the frequencies $f_{OF}$ and $[f_{OF}+f_{RF}]$ respectively. The RF signal (electric signal ed) detected by the RF spectrum analyzer 39 after the optical/electrical conversion performed by the optical receiver 38 contains signals having frequencies $f_L$, and $[f_L+f_{RF}]$, and these signals correspond to light signals having frequencies $[f_{OF}+f_L]$ and $[f_{OF}+f_L+f_{RF}]$ respectively. That is, it is possible to determine the strength ratio between the light signals having the frequencies $[f_{OF}+f_L]$ and $[f_{OF}+f_L+f_{RF}]$ by measuring the strength ratio between the signals having frequencies $f_L$ and $[f_L+f_{RF}]$. Further, this strength ratio between the light signals is equal to the strength ratio between the carrier and the sideband located at the frequencies $f_{OF}$ and $[f_{OF}+f_{RF}]$.

In this manner, it is possible to determine the strength ratio between the carrier and the sideband caused by the EO/MO crystal 32 by introducing the light modulator 23 and thereby measuring the strength ratio between the signals having the frequencies $f_L$ and $[f_L+f_{RF}]$. In this apparatus, the condition for maximizing the sensitivity to the electromagnetic field caused by the circuit to be measured TS is satisfied when the strength ratio (amplitude level ratio) between the carrier of the signal light ph entering the optical receiver 38 and the sideband generated by the EO/MO crystal 32 becomes 4:1 as expressed in power (i.e., fixed value). Therefore, by controlling this apparatus into the state like this, it is possible to measure the electromagnetic field with a high sensitivity. Further, it is also possible to improve both the sensitivity and the usability by equipping this apparatus with an automatic control function that puts the apparatus into the state like this.

First Exemplary Embodiment

Figure 2:
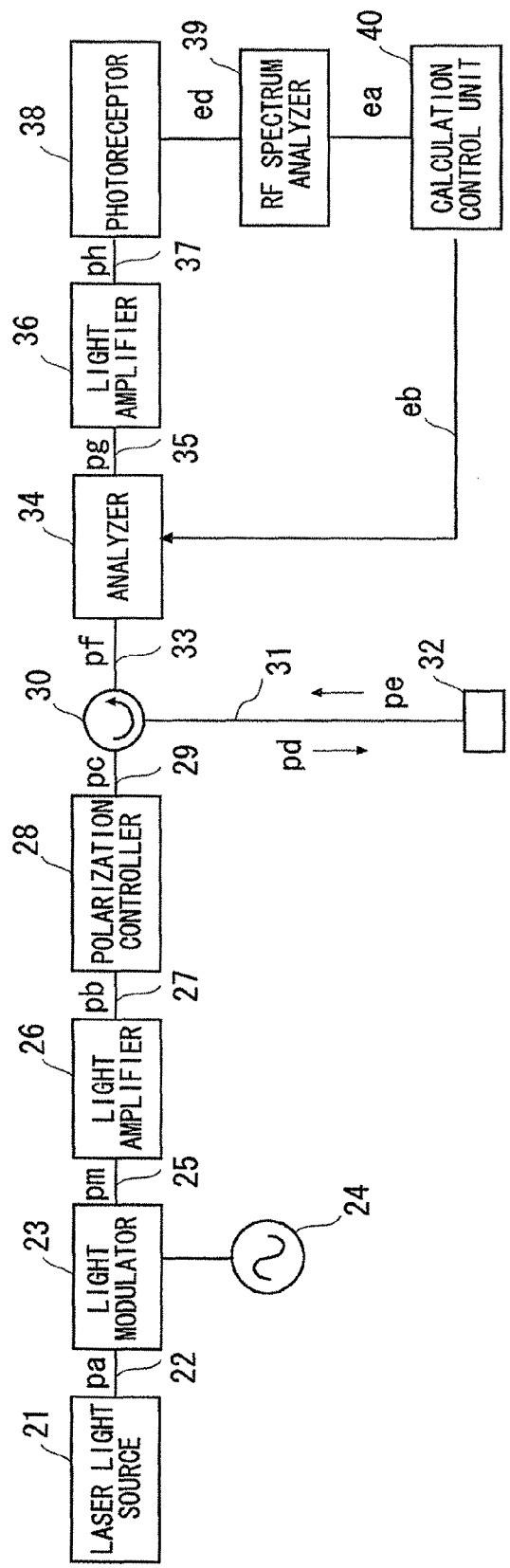
FIG. 2 is a block diagram showing a configuration of the essential part of an electromagnetic field measuring apparatus which is a first exemplary embodiment according to the invention.

FIG. 2 is a block diagram showing a configuration of the essential part of an electromagnetic field measuring apparatus which is a first exemplary embodiment according to the invention.

In the electromagnetic field measuring apparatus according to this embodiment, as shown in FIG. 2, a calculation control unit 40 is further provided in the electromagnetic field measuring apparatus shown in FIG. 1. The calculation control unit 40, which is composed of a computer that operates based on an electromagnetic field measurement control program, supplies an amplitude level control signal eb to the analyzer 34 based on the spectrum ea of the electric signal ed measured by the RF spectrum analyzer 39. Further, the analyzer 34 adjusts the amplitude level of the signal light pf by adjusting its angle with respect to the plane of polarization of the signal light pf based on the amplitude level control signal eb supplied from the calculation control unit 40.

Figure 3:
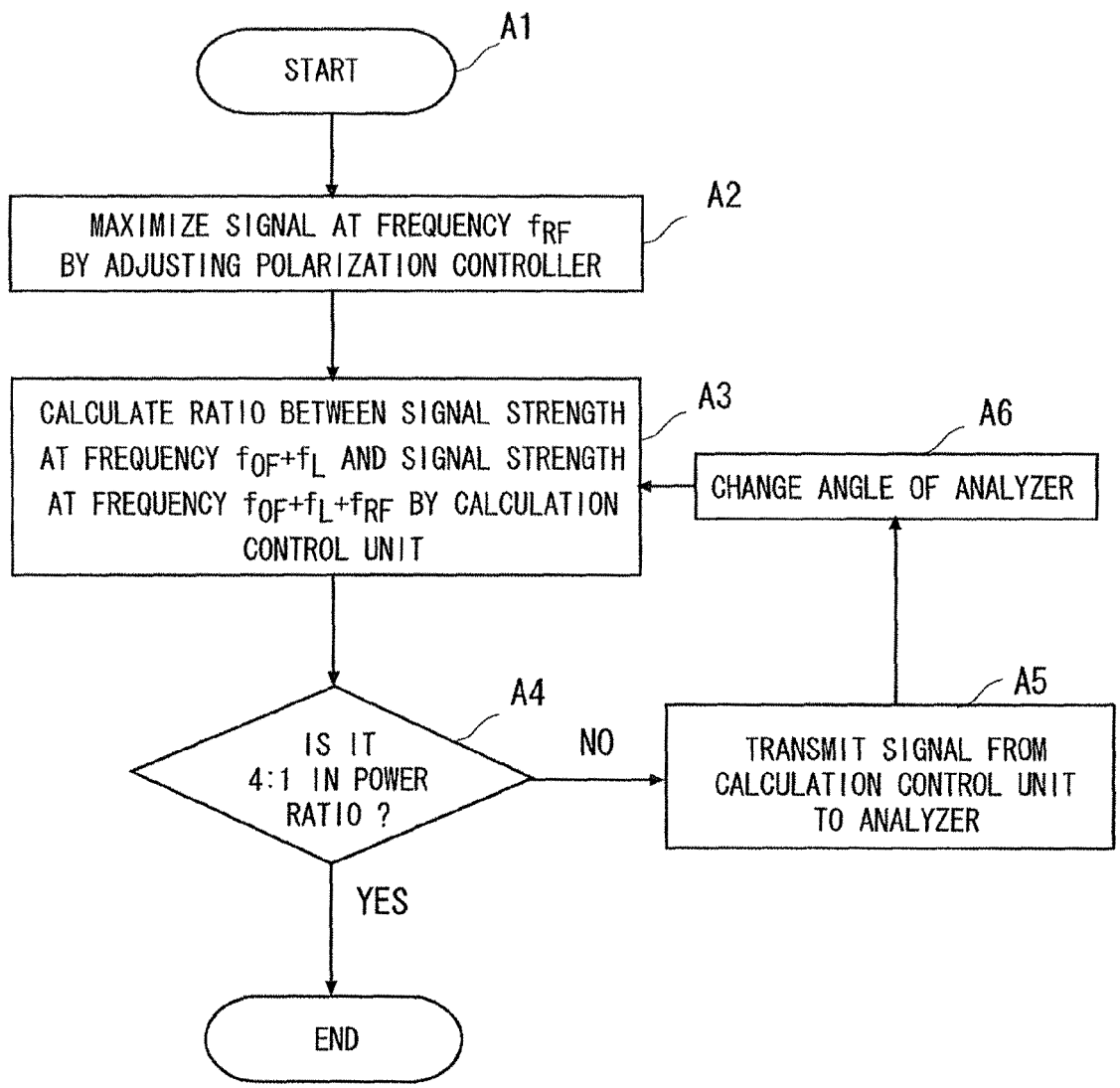
FIG. 3 is a flowchart for explaining an operation of the electromagnetic field measuring apparatus shown in FIG. 2.

FIG. 3 is a flowchart for explaining an operation of the electromagnetic field measuring apparatus shown in FIG. 2.

Detailed processing of an electromagnetic field measuring method used for the electromagnetic field measuring apparatus according to this embodiment is explained with reference to FIG. 3.

In this electromagnetic field measuring apparatus, the amplitude level of the signal light pf is adjusted by the analyzer 34 by adjusting the angle of the analyzer 34 with respect to the plane of polarization of the signal light pf based on the amplitude level control signal eb supplied from the calculation control unit 40 (amplitude level adjustment process). The amplitude level control signal eb is supplied from the calculation control unit 40 to the analyzer 34 based on the spectrum ea of the electric signal ed measured by the RF spectrum analyzer 39 (calculation control process).

That is, as shown in FIG. 3, at the start of the operation, each component of this electromagnetic field measuring apparatus is turned on (step A1). The polarization controller 28 is adjusted and the signal light pc at a frequency $f_{RF}$ is thereby maximized (step A2). The signal strength ratio between a frequency $[f_{OF}+f_L]$ and a frequency $[f_{OF}+f_L+f_{RF}]$ is calculated by the calculation control unit 40 (step A3) and it is determined whether the signal strength ratio is 4:1 or not (step A4). When the signal strength ratio is 4:1, the process is finished. When the signal strength ratio is not 4:1, an amplitude level control signal eb is transmitted from the calculation control unit 40 to the analyzer 34 (step A5). As a result, the angle of the analyzer 34 is changed (step A6) and the process returns to the step A3. In this manner, it is possible to adjust the strength ratio between the carrier that ultimately enters the optical receiver 38 and the sideband caused by the EO/MO crystal 32 to 4:1.

As described above, in the first exemplary embodiment, since the strength ratio between the carrier incident on the optical receiver 38 and the sideband caused by the EO/MO crystal 32 becomes 4:1, the electromagnetic field caused by the circuit to be measured TS is measured with a high sensitivity. In particular, in cases where the object to be measured is an electronic apparatus having a densely-packed area, electromagnetic field measurement is performed in the internal densely-packed area on an ordinary basis, thus making it possible to make a detailed evaluation of signals and noises and thereby contributing to electrically high-quality circuit designing. As a result, it is possible to reduce the re-working in product developments and the like. Further, this electromagnetic field measuring apparatus can be applied to the operation check and/or the fault diagnosis of minuscule devices located inside electronic apparatuses, thus making it possible to improve the reliability of products.

Second Exemplary Embodiment

Figure 4:
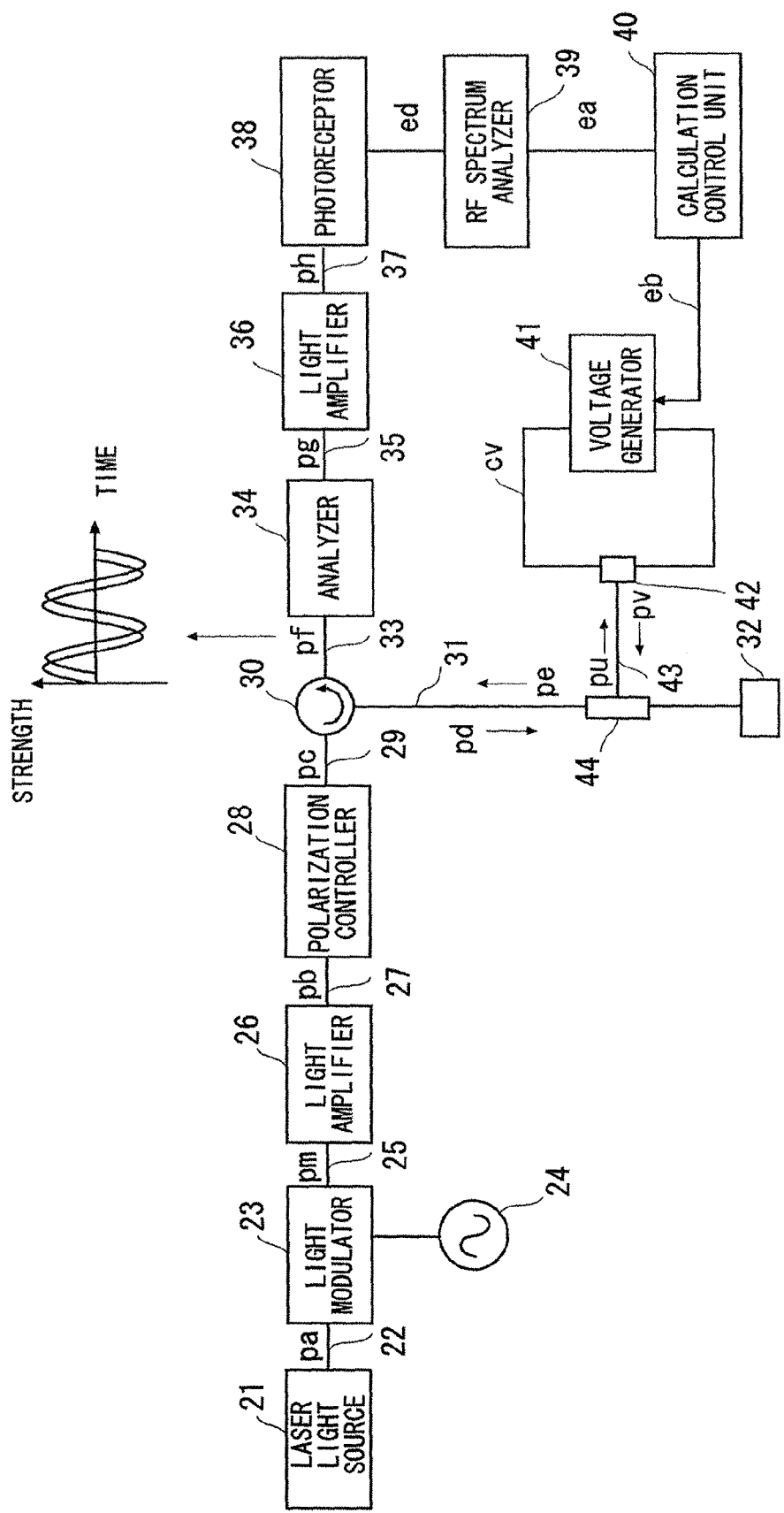
FIG. 4 is a block diagram showing a configuration of the essential part of an electromagnetic field measuring apparatus which is a second exemplary embodiment according to the invention.

FIG. 4 is a block diagram showing a configuration of the essential part of an electromagnetic field measuring apparatus which is a second exemplary embodiment according to the invention.

In the electromagnetic field measuring apparatus according to this embodiment, as shown in FIG. 4, a calculation control unit 40, a voltage generator 41, a piezoelectric element 42, an optical fiber 43, and an optical coupler 44 are further provided in the electromagnetic field measuring apparatus shown in FIG. 1. The optical coupler 44 causes the signal light (modulated light) pd incident on the EO/MO crystal 32 to branch and thereby emits the branched signal light to the optical fiber 43 as branched modulated light pu. Further, the optical coupler 44 lets the signal light pe incident from the EO/MO crystal 32 to pass therethrough. The piezoelectric element 42 receives the branched modulated light pu emitted from the optical coupler 44, through the optical fiber 43, adjusts the phase of the branched modulated light based on an applied control voltage cv, and emits the adjusted signal light to the optical coupler 44 through the optical fiber 43 as amplitude level adjustment modulated light pv and thereby combines the amplitude level adjustment modulated light pv with the signal light pe. The voltage generator 41 generates the control voltage cv based on an amplitude level control signal eb supplied from the calculation control unit 40 and applies the generated control signal to the piezoelectric element 42. The calculation control unit 40 supplies the amplitude level control signal eb to the voltage generator 41 based on the spectrum ea of the electric signal ed measured by the RF spectrum analyzer 39.

Figure 5:
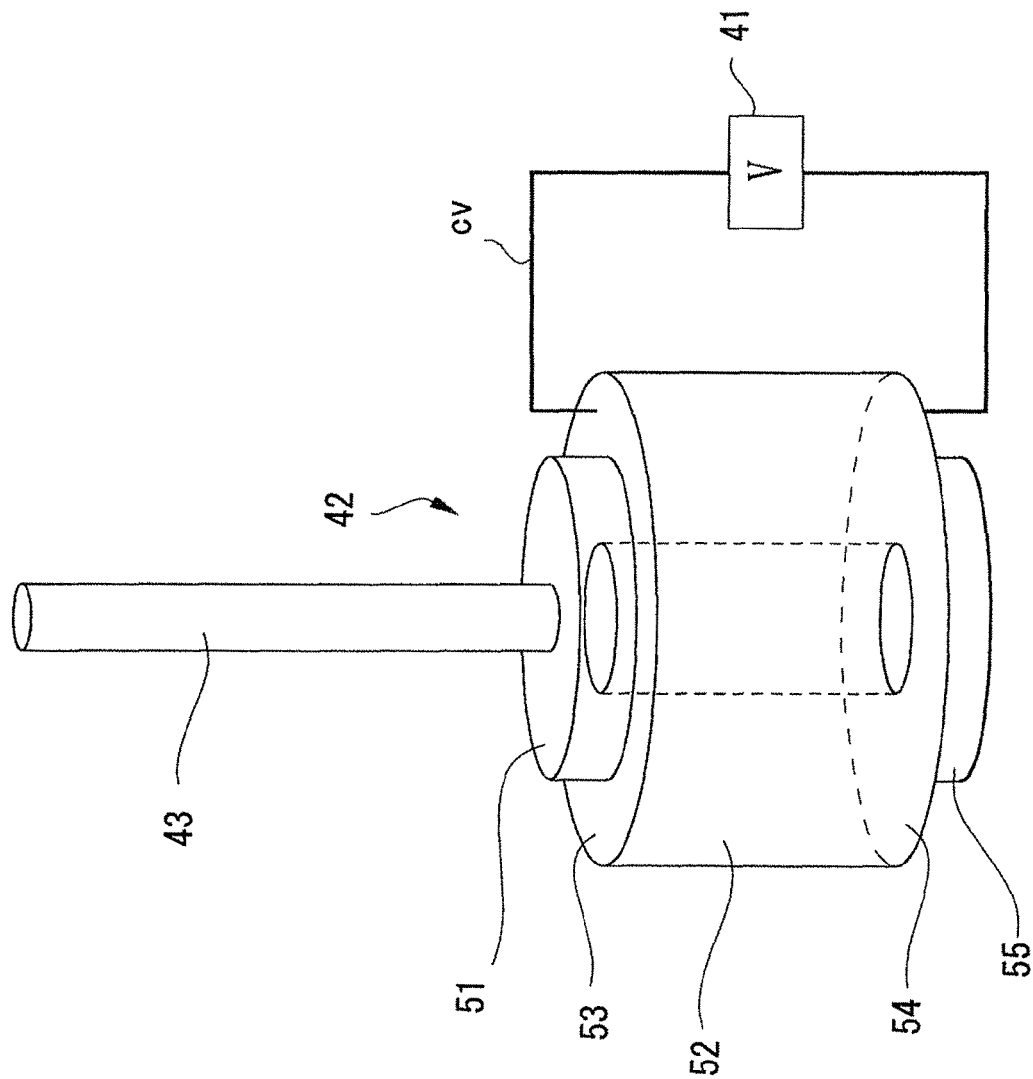
FIG. 5 shows a piezoelectric element 42 and its peripheral components shown in FIG. 4.

FIG. 5 shows an example of the configuration of the piezoelectric element 42 and its peripheral components shown in FIG. 4.

In this piezoelectric element 42, a ring-shaped piezoelectric material 52 is formed at the tip of the optical fiber 43 with a glass spacer 51 interposed therebetween. Examples of the piezoelectric material used for this purpose include lead zirconate titanate (PZT). Electrodes 53 and 54 are formed on the top and bottom surfaces, respectively, of the piezoelectric material 52, and the voltage generator 41 is connected to these electrodes 53 and 54. Further, on the bottom surface of the piezoelectric material 52, a light reflection film 55 is provided under the electrode 54. The electrodes 53 and 53 are formed, for example, by sputtering, and other components are bonded, for example, by using an optically-transparent resin.

In this piezoelectric element 42, light that has passed through the optical fiber 42 enters the internal space of the piezoelectric material 52 after passing through the glass spacer 51, and after reflected on the light reflection film 55 on the bottom surface, retunes to the optical fiber 42 again. The thickness of the piezoelectric material 52 (distance between the electrodes) can be changed according to the control voltage cv applied by the voltage generator 41, and therefore the optical path length of the light within the space can be changed and thereby adjusted. In this manner, the phase difference between the carrier light that has returned after passing through the piezoelectric element 42 and the carrier light that has returned from the EO/MO crystal 32 is adjusted.

Figure 6:
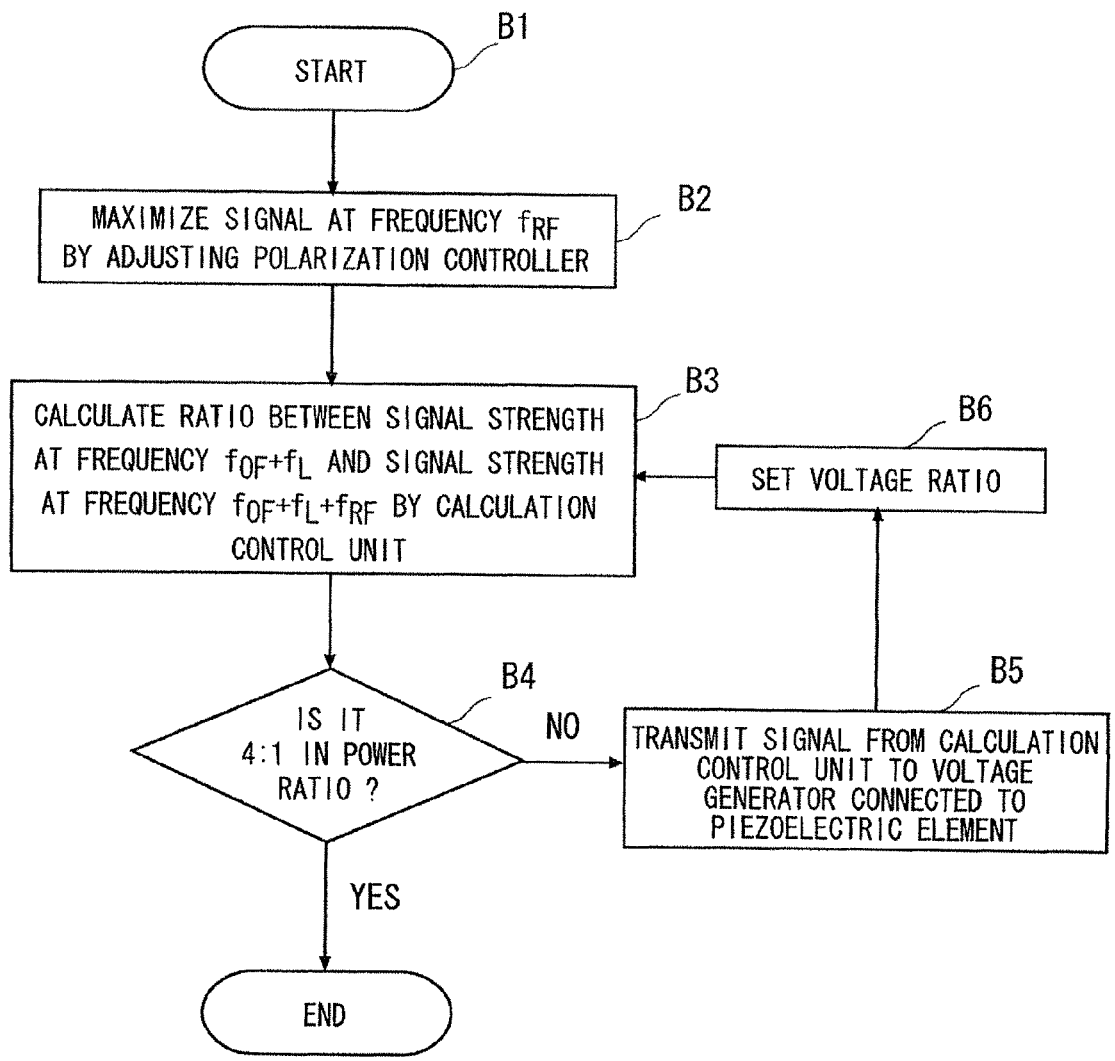
FIG. 6 is a flowchart for explaining an operation of the electromagnetic field measuring apparatus shown in FIG. 4.

FIG. 6 is a flowchart for explaining an operation of the electromagnetic field measuring apparatus shown in FIG. 4.

Detailed processing of an electromagnetic field measuring method used for the electromagnetic field measuring apparatus according to this embodiment is explained with reference to FIG. 6.

In this electromagnetic field measuring apparatus, the signal light (modulated light) pd incident on the EO/MO crystal 32 branches at the optical coupler 44 and is emitted as branched modulated light pu. Further, the optical coupler 44 lets the signal light pe incident from the EO/MO crystal 32 to pass therethrough (branch/pass process). A control voltage cv is generated based on an amplitude level control signal eb supplied from the calculation control unit 40 by the voltage generator 41 and the generated control voltage cv is applied to the piezoelectric element 42 (control voltage generation process). The branched modulated light pu emitted from the optical coupler 44 enters to the piezoelectric element 42. Then, the phase of the branched modulated light is adjusted by the piezoelectric element 42 based on the control voltage cv applied by the voltage generator 41, and the adjusted signal light is emitted to the optical coupler 44 as amplitude level adjustment modulated light pv. Further, the amplitude level adjustment modulated light pv is combined with the signal light pe in the optical coupler 44 (phase adjustment process). In this case, since the phase of the carrier of the amplitude level adjustment modulated light pv and that of the signal light pe are different from each other before the combining process, the amplitude level of the carrier after the combining process is attenuated. An amplitude level control signal eb is supplied to the voltage generator 41 based on the spectrum ea of the electric signal ed measured by the RF spectrum analyzer 39, by the calculation control unit 40 (calculation control process).

That is, as shown in FIG. 6, each component of this electromagnetic field measuring apparatus is turned on at the start of the operation (step B1). The polarization controller 28 is adjusted and the signal light pc at a frequency $f_{RF}$ is thereby maximized (step B2). The signal strength ratio between a frequency $[f_{OF}+f_L]$ and a frequency $[f_{OF}+f_L+f_{RF}]$ is calculated by the calculation control unit 40 (step B3) and it is determined whether the signal strength ratio is 4:1 or not (step B4). When the signal strength ratio is 4:1, the process is finished. When the signal strength ratio is not 4:1, an amplitude level control signal eb is transmitted from the calculation control unit 40 to the voltage generator 41 (step B5). As a result, the voltage value of the control voltage cv is set (step B6) and the process returns to the step B3. In this manner, it is possible to adjust the strength ratio between the carrier that ultimately enters the optical receiver 38 and the sideband caused by the EO/MO crystal 32 to 4:1.

As described above, similarly to the first exemplary embodiment, in the second exemplary embodiment, since the strength ratio between the carrier incident on the optical receiver 38 and the sideband caused by the EO/MO crystal 32 becomes 4:1, the electromagnetic field caused by the circuit to be measured TS is measured with a high sensitivity.

Third Exemplary Embodiment

Figure 7:
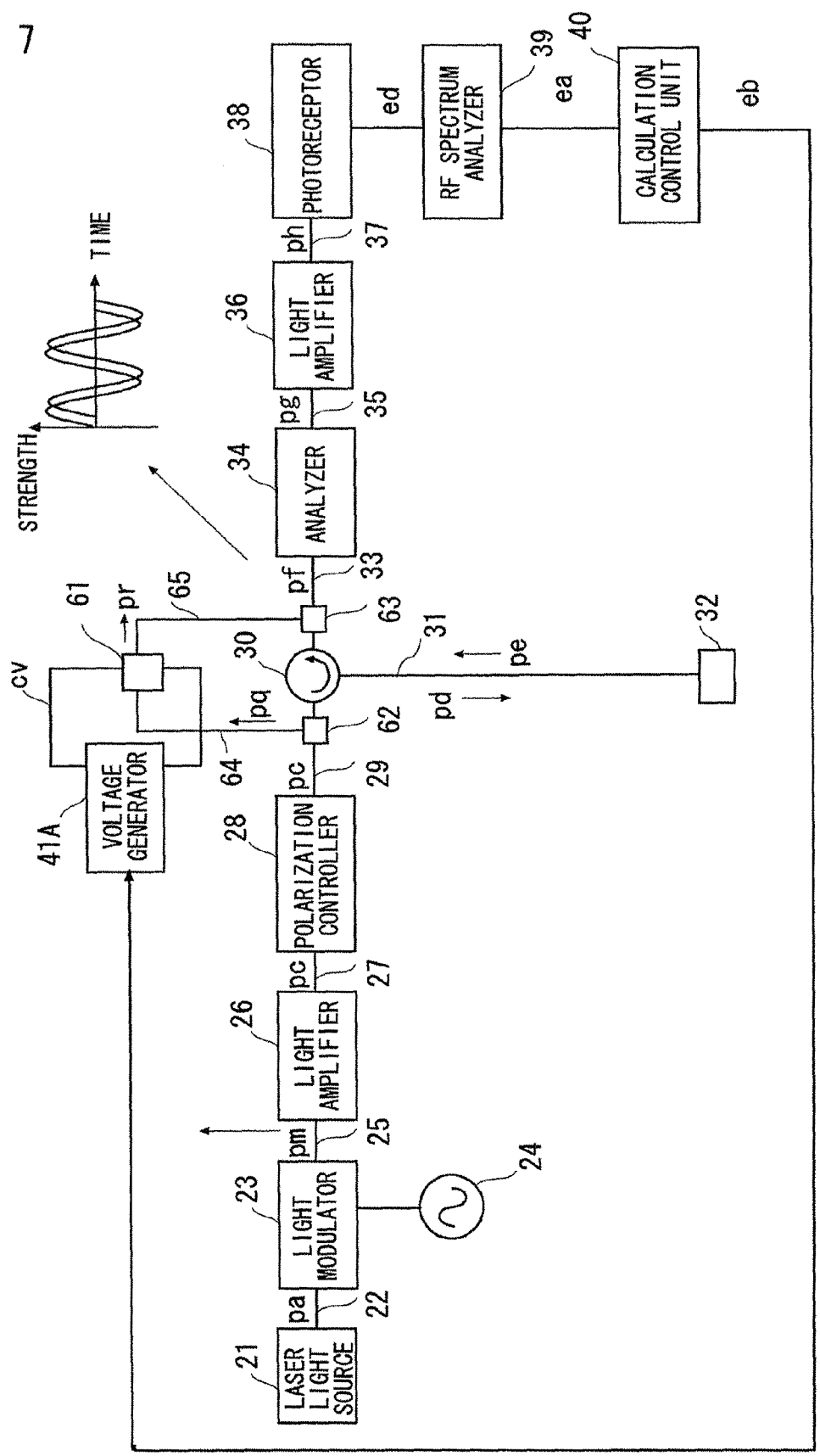
FIG. 7 is a block diagram showing a configuration of the essential part of an electromagnetic field measuring apparatus which is a third exemplary embodiment according to the invention.

FIG. 7 is a block diagram showing a configuration of the essential part of an electromagnetic field measuring apparatus which is a third exemplary embodiment according to the invention.

In the electromagnetic field measuring apparatus according to this embodiment, as shown in FIG. 7, a calculation control unit 40, a voltage generator 41A, a light modulation element 61, an optical coupler 62, an optical couple 63, and optical fibers 64 and 65 are further provided in the electromagnetic field measuring apparatus shown in FIG. 1. The optical coupler 62 causes the signal light pc emitted from the polarization controller 28 to branch and thereby emits the branched signal light to the optical fiber 64 as branched modulated light pq. The light modulation element 61 receives the branched modulated light pq emitted from the optical coupler 62 through the optical fiber 64, adjusts the phase of the branched modulated light based on an applied control voltage cv, and emits the adjusted signal light to the optical fiber 65 as amplitude level adjustment modulated light pr. The optical coupler 63 combines the amplitude level adjustment modulated light pr incident from the light modulation element 61 with the signal light pe incident from the EO/MO crystal 32 through the optical fiber 31 and the optical circulator 30. The voltage generator 41A generates the control voltage cv based on an amplitude level control signal eb supplied from the calculation control unit 40 and applies the generated control signal to the light modulation element 61. The calculation control unit 40 supplies the amplitude level control signal eb to the voltage generator 41A based on the spectrum ea of the electric signal ed measured by the RF spectrum analyzer 39.

Figure 8:
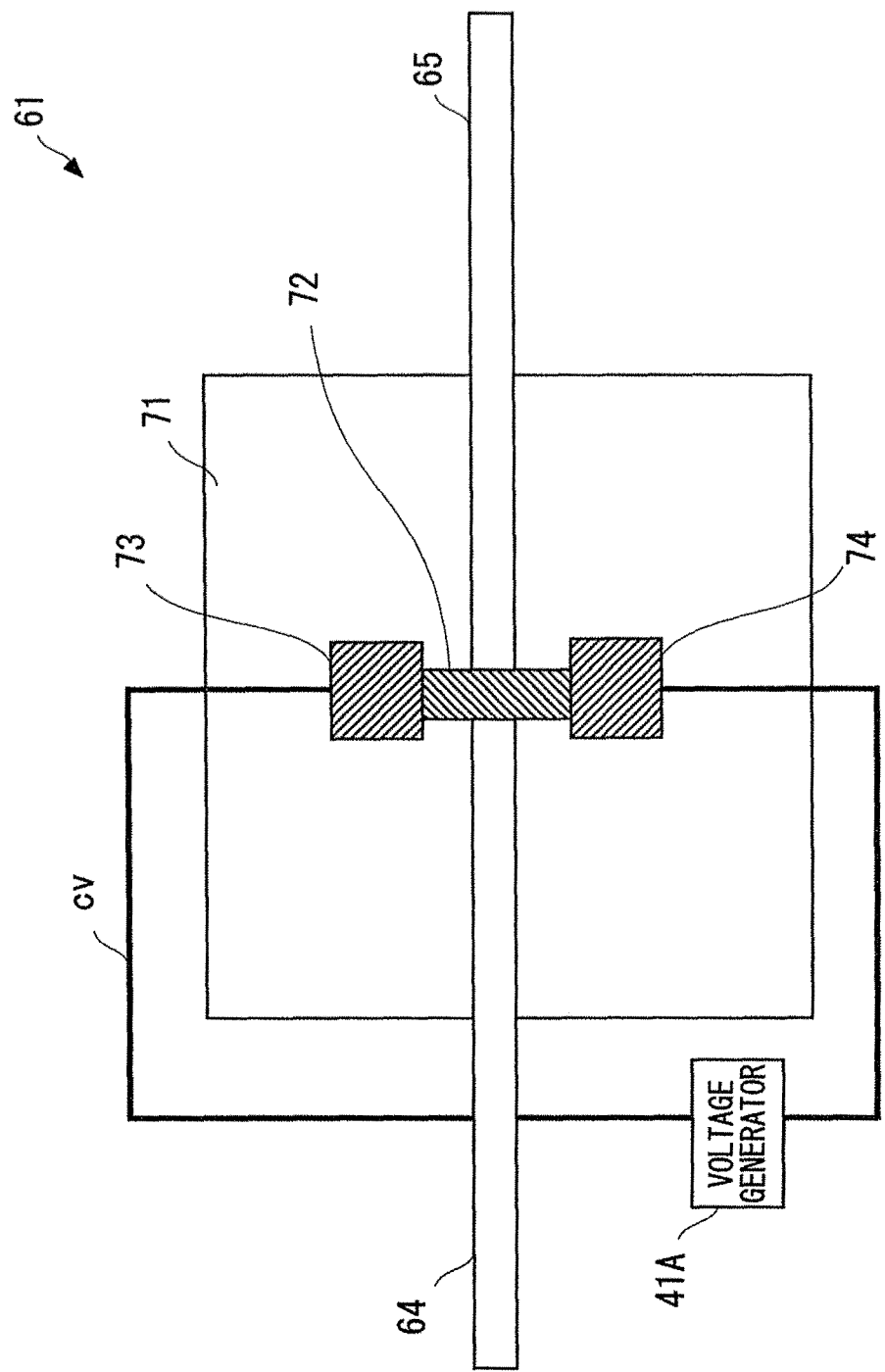
FIG. 8 shows a light modulation element 61 and its peripheral components shown in FIG. 7.

FIG. 8 shows an example of the configuration of the light modulation element 61 and its peripheral components shown in FIG. 7.

In this light modulation element 61, a rectangular EO film 72 and electrodes 73 and 74 located on both ends of the rectangular EO film 72 are formed on the surface of a glass substrate 71. Further, the optical fibers 64 and 65 are bonded to other both ends of the EO film 72. Further, the electrodes 73 and 74 are connected to the voltage generator 41A. Examples of the material of the EO film 72 include lead zirconate titanate and lead lanthanum zirconate titanate (PZT and PLZT). As for the method of forming the EO film 72 on the glass substrate 71, an aerosol deposition (AD) method, for example, may be used. An EO film 72 having a film-thickness of several-tens micron is formed by the AD method. After the EO film 72 is formed on the glass substrate 71, electrodes 73 and 74 are formed on the EO film 72, for example, by sputtering. After that, the EO film 72 is bonded to the optical fibers 64 and 65, for example, by using an optically-transparent resin.

In this light modulation element 61, light enters the optical fiber 65 after passing through the optical fiber 64 and the EO film 72, and the phase of the light that passes through the EO film 72 changes according to the control voltage cv applied by the voltage generator 41A. In this manner, the phase difference between the carrier light that has passed through the light modulation element 61 and the carrier light that has returned from the EO/MO crystal 32 is adjusted.

In this electromagnetic field measuring apparatus, the signal light pc incident from the polarization controller 28 branches at the optical coupler 62 and is emitted to the optical fiber 64 as branched modulated light pq (first branch process). The branched modulated light pq emitted from the optical coupler 62 enters to the light modulation element 61 through the optical fiber 64. Then, the phase of the branched modulated light is adjusted by the light modulation element 61 based on the applied control voltage cv, and the adjusted signal light is emitted to the optical fiber 65 as amplitude level adjustment modulated light pr (phase adjustment process). The amplitude level adjustment modulated light pr incident from the light modulation element 61 through the optical fiber 65 is combined with the signal light pe incident from the EO/MO crystal 32 through the optical fiber 31 and the optical circulator 30 by the optical coupler 63 (light combining process). In this case, since the phase of the carrier of the amplitude level adjustment modulated light pr and that of the signal light pe are different from each other before the combining process, the amplitude level of the carrier after the combining process is attenuated.

A control voltage cv is applied to the light modulation element 61 based on the amplitude level control signal eb supplied from the calculation control unit 40, by the voltage generator 41A (control voltage generation process). The amplitude level control signal eb is supplied to the voltage generator 41A based on the spectrum ea of the electric signal ed measured by the RF spectrum analyzer 39, by the calculation control unit 40 (calculation control process). In this manner, similarly to the first exemplary embodiment, in this electromagnetic field measuring apparatus, since the strength ratio between the carrier incident on the optical receiver 38 and the sideband caused by the EO/MO crystal 32 becomes 4:1, the electromagnetic field caused by the circuit to be measured TS is measured with a high sensitivity.

Fourth Exemplary Embodiment

Figure 9:
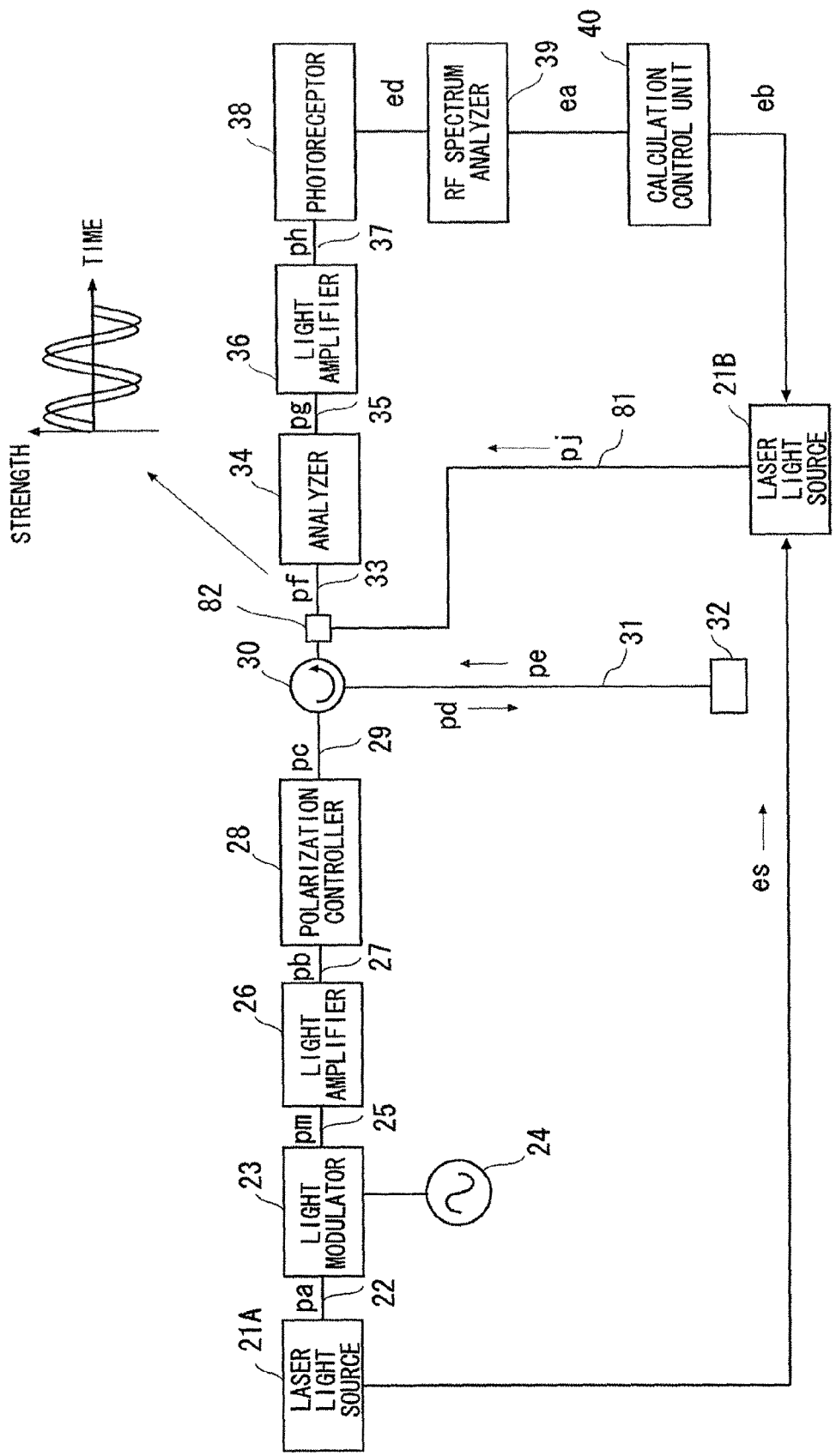
FIG. 9 is a block diagram showing a configuration of the essential part of an electromagnetic field measuring apparatus which is a fourth exemplary embodiment according to the invention.

FIG. 9 is a block diagram showing a configuration of the essential part of an electromagnetic field measuring apparatus which is a fourth exemplary embodiment according to the invention.

In the electromagnetic field measuring apparatus according to this embodiment, as shown in FIG. 9, a laser light source 21A equipped with a new function is provided in place of the laser light source 21 in the electromagnetic field measuring apparatus shown in FIG. 1. Further, a calculation control unit 40, a laser light source 21B, and an optical fiber 81, and an optical coupler 82 are also provided.

The laser light source 21A is configured to output a reference signal es indicating the frequency, the phase, and the amplitude of the carrier signal light pa, in addition to having the same functions of the laser light source 21. The laser light source 21B emits an amplitude level adjustment laser beam pj having the same frequency and the same amplitude as those of the carrier signal light pa, and having a phase according to the amplitude level control signal eb supplied from the calculation control unit 40, to the optical fiber 81 based on the reference signal es output from the laser light source 21A. The optical coupler 82 combines the amplitude level adjustment laser beam pj incident through the optical fiber 81 with the signal light pe incident from the EO/MO crystal 32 through the optical fiber 31 and the optical circulator 30, and emits the combined signal light to the fiber 33 as signal light pf. The calculation control unit 40 supplies the amplitude level control signal eb to the laser light source 21B based on the spectrum ea of the electric signal ed measured by the RF spectrum analyzer 39.

Figure 10:
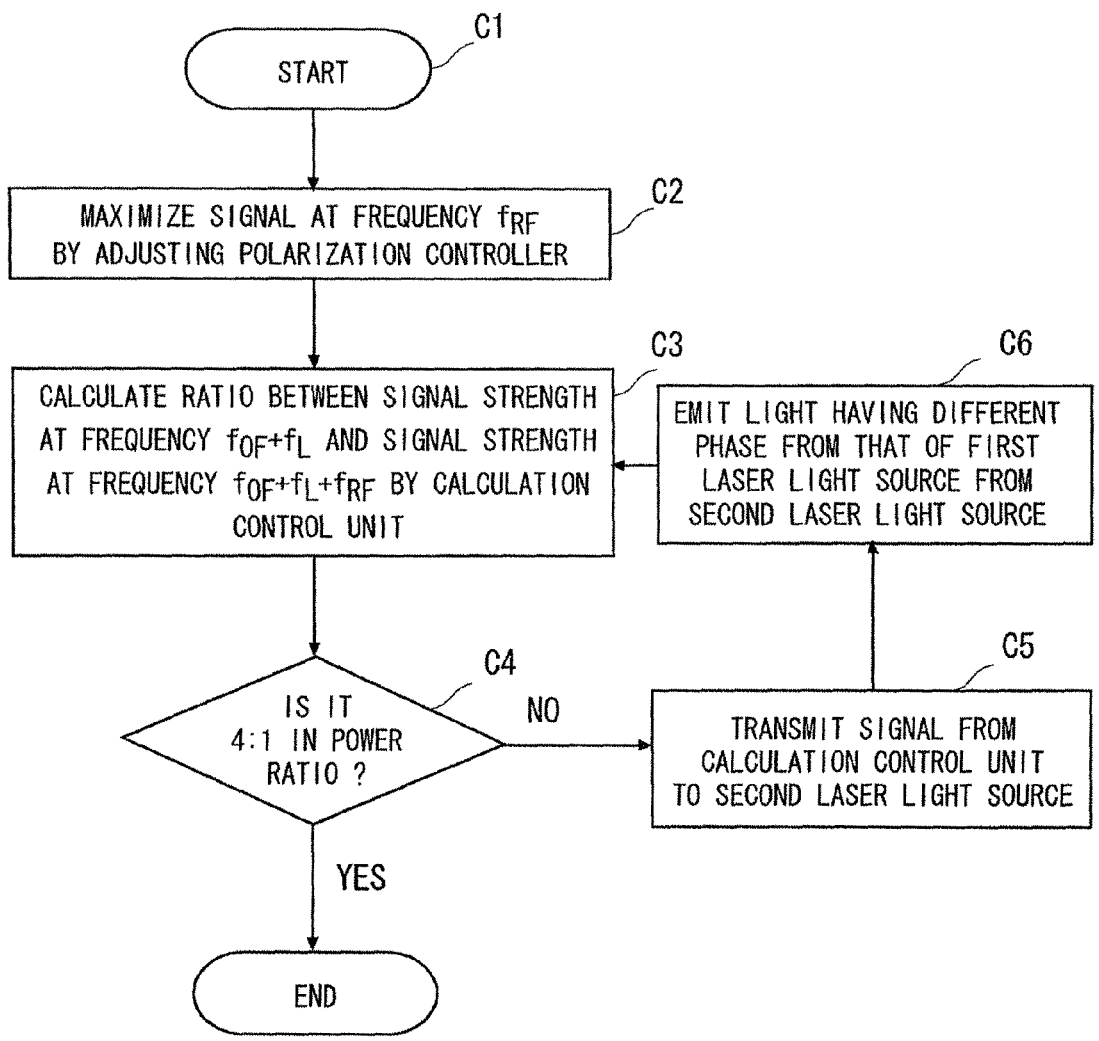
FIG. 10 is a flowchart for explaining an operation of the electromagnetic field measuring apparatus shown in FIG. 9.
Figure 11:
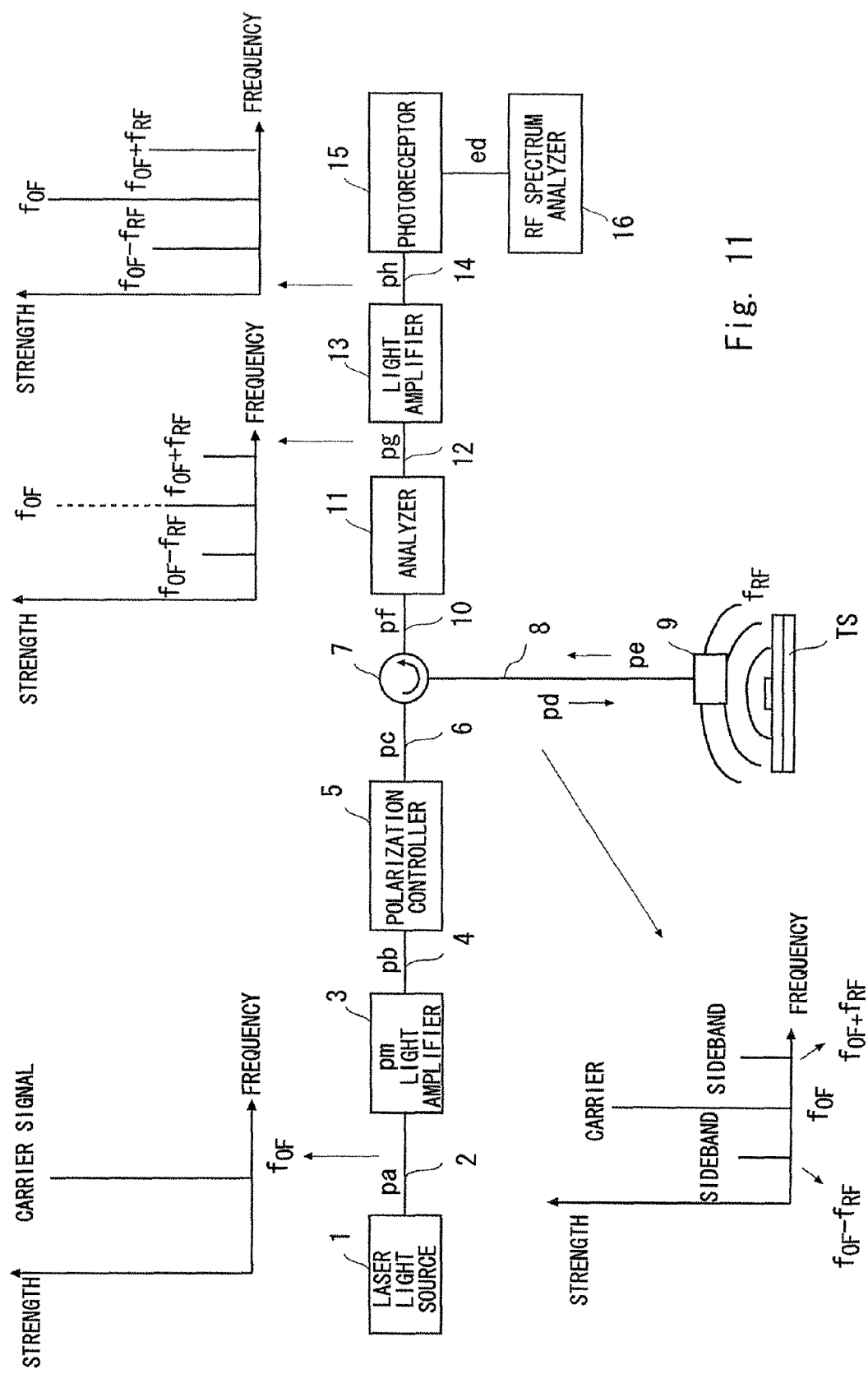
FIG. 11 schematically shows a general configuration of an electromagnetic field measuring apparatus and a light spectrum of each component.

FIG. 10 is a flowchart for explaining an operation of the electromagnetic field measuring apparatus shown in FIG. 9.

Detailed processing of an electromagnetic field measuring method used for the electromagnetic field measuring apparatus according to this embodiment is explained with reference to FIG. 10.

In this electromagnetic field measuring apparatus, a reference signal es indicating the frequency, the phase, and the amplitude of the carrier signal light pa is output by the laser light source 21A. An amplitude level adjustment laser beam pj having the same frequency and the same amplitude as those of the carrier signal light pa, and having a phase according to the amplitude level control signal eb is emitted by the laser light source 21B based on the reference signal es output from the laser light source 21A (adjustment laser beam emitting process). The amplitude level adjustment laser beam pj is combined with the signal light pe incident from the EO/MO crystal 32 by the optical coupler 82 (light combining process). In this case, since the phase of the carrier of the amplitude level adjustment laser beam pj and that of the signal light pe are different from each other before the combining process, the amplitude level of the carrier after the combining process is attenuated. The amplitude level control signal eb is supplied to the laser light source 21B based on the spectrum ea of the electric signal ed measured by the RF spectrum analyzer 39, by the calculation control unit 40 (calculation control process).

That is, as shown in FIG. 10, each component of this electromagnetic field measuring apparatus is turned on at the start of the operation (step C1). The polarization controller 28 is adjusted and the signal light pc at a frequency $f_{RF}$ is thereby maximized (step C2). The signal strength ratio between a frequency $[f_{OF}+f_L]$ and a frequency $[f_{OF}+f_L+f_{RF}]$ is calculated by the calculation control unit 40 (step C3) and it is determined whether the signal strength ratio is 4:1 or not (step C4). When the signal strength ratio is 4:1, the process is finished. When the signal strength ratio is not 4:1, an amplitude level control signal eb is transmitted from the calculation control unit 40 to the laser light source 21B (second laser light source) (step C5). Then, light having a different phase from that of the laser light source 21A, i.e., an amplitude level adjustment laser beam pj whose phase is controlled based on the amplitude level control signal eb is emitted from the laser light source 21B (step C6), and the process returns to the step C3. In this manner, it is possible to adjust the strength ratio between the carrier that ultimately enters the optical receiver 38 and the sideband caused by the EO/MO crystal 32 to 4:1.

As described above, similarly to the first exemplary embodiment, in the fourth exemplary embodiment, since the strength ratio between the carrier incident on the optical receiver 38 and the sideband caused by the EO/MO crystal 32 becomes 4:1, the electromagnetic field caused by the circuit to be measured TS is measured with a high sensitivity.

Although the present invention is described as a hardware configuration in the above-described exemplary embodiments, the present invention is not limited to the hardware configurations. In the present invention, the amplitude level ratio control process in the above-described exemplary embodiments can be also implemented by causing a CPU (Central Processing Unit) to execute a computer program.

The program can be stored by using various types of non-transitory computer readable media, and can be supplied to computers. Examples of the non-transitory computer readable media include various types of tangible storage media. Examples of the non-transitory computer readable media include a magnetic recording medium (such as a flexible disk, a magnetic tape, and a hard disk drive), a magneto-optic recording medium (such as a magneto-optic disk), a CD-ROM (Read Only Memory), a CD-R, and a CD-R/W, and a semiconductor memory (such as a mask ROM, a PROM (Programmable ROM), an EPROM (Erasable PROM), a flash ROM, and a RAM (Random Access Memory)). Further, the program can be supplied to computers by using various types of transitory computer readable media. Examples of the transitory computer readable media include an electrical signal, an optical signal, and an electromagnetic wave. The transitory computer readable media can be used to supply programs to computer through a wire communication path such as an electrical wire and an optical fiber, or wireless communication path.

Although exemplary embodiments according to the invention have been explained in detail with reference to the drawings, the specific configuration is not limited to these exemplary embodiments. Any design modifications made without departing from the scope and the spirit of the invention are also included in the invention.

This application is based upon and claims the benefit of priority from Japanese patent application No. 2009-164055, filed on Jul. 10, 2009, the disclosure of which is incorporated herein in its entirety by reference.

INDUSTRIAL APPLICABILITY

The invention can be applied to electromagnetic field measuring apparatuses that are used as a packaged electric design support tool or a circuit fault diagnosis tool. That is, by carrying out electromagnetic field measurement on an LSI or near an LSI package by using this apparatus, it is possible to obtain information that needs to be fed back to the electric design, or to verify the operation of circuits.

REFERENCE SIGNS LIST 21, 21A LASER LIGHT SOURCE
21B LASER LIGHT SOURCE (AMPLITUDE LEVEL ADJUSTMENT LASER LIGHT SOURCE)
22, 25, 27, 29, 31, 33, 35, 37, 43, 64, 65, 81 OPTICAL FIBER (PART OF OPTICAL COMPONENT)
23 LIGHT MODULATOR (PART OF LIGHT MODULATION MEANS)
24 LOCAL OSCILLATOR (PART OF LIGHT MODULATION MEANS)
26, 36 LIGHT AMPLIFIER (PART OF OPTICAL COMPONENT)
28 POLARIZATION CONTROLLER (PART OF PLANE OF POLARIZATION ADJUSTMENT MEANS)
30 OPTICAL CIRCULATOR (PART OF OPTICAL COMPONENT)
32 EO/MO CRYSTAL (ELECTROMAGNETIC FIELD SENSOR)
34 ANALYZER (PART OF AMPLITUDE LEVEL RATIO CONTROL MEANS)
38 OPTICAL RECEIVER
39 RF SPECTRUM ANALYZER (SPECTRUM ANALYZER)
40 CALCULATION CONTROL UNIT (PART OF AMPLITUDE LEVEL RATIO CONTROL MEANS)
41, 41A CALCULATION CONTROL UNIT (PART OF AMPLITUDE LEVEL RATIO CONTROL MEANS)
42 PIEZOELECTRIC ELEMENT (PART OF AMPLITUDE LEVEL RATIO CONTROL MEANS)
44, 62, 63, 82 OPTICAL COUPLER (PART OF AMPLITUDE LEVEL RATIO CONTROL MEANS)
51 GLASS SPACER (PART OF PIEZOELECTRIC ELEMENT 42)
52 PIEZOELECTRIC MATERIAL (PART OF PIEZOELECTRIC ELEMENT 42)
53, 54 ELECTRODE (PART OF PIEZOELECTRIC ELEMENT 42)
55 LIGHT REFLECTION FILM (PART OF PIEZOELECTRIC ELEMENT 42)
61 LIGHT MODULATION ELEMENT (PART OF AMPLITUDE LEVEL RATIO CONTROL MEANS)
71 GLASS SUBSTRATE (PART OF LIGHT MODULATION ELEMENT 61)
72 EO FILM (PART OF LIGHT MODULATION ELEMENT 61)
73, 74 ELECTRODE (PART OF LIGHT MODULATION ELEMENT 61)

The invention claimed is:

1. An electromagnetic field measuring apparatus comprising:
a laser light source that emits a laser beam having a predetermined frequency as a carrier signal light;
a light modulator that generates a modulated light by modulating the carrier signal light at a predetermined local oscillation frequency, and emitting the modulated light;
a certain optical component;
an electromagnetic field sensor that generates a signal light by exposing the modulated light incident through the optical component to an electromagnetic field of a radio frequency band caused by an object to be measured and thereby modulating the modulated light, and emits the signal light;
an optical receiver that receives the signal light from the electromagnetic field sensor through the optical component and outputs an electric signal having a same radio frequency band as the electromagnetic field;
a spectrum analyzer that measures a spectrum of the electric signal; and
an amplitude level ratio controller that controls an amplitude level ratio between a carrier and a sideband contained in the signal light incident on the optical receiver to a fixed value based on the spectrum of the electric signal measured by the spectrum analyzer.

2. The electromagnetic field measuring apparatus according to claim 1, wherein the amplitude ratio controller is configured to adjust an amplitude level of the carrier.

3. The electromagnetic field measuring apparatus according to claim 2, wherein
the optical component comprises a plane of polarization adjuster that adjusts a plane of polarization of the modulated light emitted from the light modulator to a predetermined direction, and
the amplitude level ratio controller comprises:
a calculation control unit that outputs an amplitude level control signal based on the spectrum of the electric signal measured by the spectrum analyzer; and
an analyzer that adjusts the amplitude level of the carrier by adjusting an angle with respect to a plane of polarization of the carrier based on the amplitude level control signal.

4. The electromagnetic field measuring apparatus according to claim 2, wherein the amplitude level ratio controller comprises:
an optical coupler that generates branched modulated light by causing the modulated light incident on the electromagnetic field sensor to branch and emits the branched modulated light, and allows the signal light emitted from the electromagnetic field sensor to pass therethrough;
a calculation control unit that outputs an amplitude level control signal based on the spectrum of the electric signal measured by the spectrum analyzer;
a voltage generator that generates a control voltage based on the amplitude level control signal; and
a piezoelectric element that generates an amplitude level adjustment modulated light by adjusting a phase of the branched modulated light emitted from the optical coupler based on the control voltage, and emits the amplitude level adjustment modulated light to the optical coupler and thereby combines the amplitude level adjustment modulated light with the signal light.

5. The electromagnetic field measuring apparatus according to claim 2, wherein the amplitude level ratio controller comprises:
- a first optical coupler that generates branched modulated light by causing the modulated light incident through the optical component to branch, and emits the branched modulated light;
- a calculation control unit that outputs an amplitude level control signal based on the spectrum of the electric signal measured by the spectrum analyzer;
- a voltage generator that generates a control voltage based on the amplitude level control signal;
- a light modulation element that generates an amplitude level adjustment modulated light by adjusting a phase of the branched modulated light emitted from the first optical coupler based on the control voltage, and emits the amplitude level adjustment modulated light; and
- a second optical coupler that combines the amplitude level adjustment modulated light emitted from the light modulation element with the signal light emitted from the electromagnetic field sensor.

6. The electromagnetic field measuring apparatus according to claim 2, wherein
- the laser light source is configured to output a reference signal indicating a frequency, a phase, and an amplitude of the carrier signal light, and
- the amplitude level ratio controller comprises:
- a calculation control unit that outputs an amplitude level control signal based on the spectrum of the electric signal measured by the spectrum analyzer;
- an amplitude level adjustment laser light source that emits an amplitude level adjustment laser beam having a same frequency and a same amplitude as those of the carrier signal light, and having a phase according to the amplitude level control signal, based on the reference signal; and
- an optical coupler that combines the amplitude level adjustment laser beam with the signal light emitted from the electromagnetic field sensor.

7. The electromagnetic field measuring apparatus according to claim 1, wherein the amplitude level ratio controller is configured to control the amplitude level ratio between the carrier and the sideband to 4:1.

8. The electromagnetic field measuring apparatus according to claim 1, wherein the amplitude level ratio controller is configured to control the amplitude level ratio between the carrier and the sideband contained in the signal light incident on the optical receiver to a fixed value based on a spectrum corresponding to the local oscillation frequency and a frequency obtained by adding a radio frequency band of the electromagnetic field to that local oscillation frequency among spectrums of the electric signal measured by the spectrum analyzer.

9. A non-transitory computer readable medium storing an electromagnetic field measurement control program that causes a computer to control the amplitude level ratio controller according to claim 1.

10. An electromagnetic field measuring method comprising:
- a carrier signal light emitting process of emitting a laser beam having a predetermined frequency as a carrier signal light;
- a modulated light emitting process of generating a modulated light by modulating the carrier signal light at a predetermined local oscillation frequency, and emitting the modulated light;
- a signal light emitting process of generating a signal light by exposing the modulated light incident through a certain optical component to an electromagnetic field of a radio frequency band caused by an object to be measured and thereby modulating the modulated light, and emitting the signal light;
- an electric signal output process of outputting an electric signal having a same radio frequency band as the electromagnetic field based on the signal light incident through the optical component;
- a spectrum measurement process of measuring a spectrum of the electric signal; and
- an amplitude level ratio control process of controlling an amplitude level ratio between a carrier and a sideband contained in the signal light incident through the optical component to a fixed value based on the spectrum of the electric signal measured in the spectrum measurement process.

11. The electromagnetic field measuring method according to claim 10, wherein in the amplitude level control process, an amplitude level of the carrier is adjusted.

12. The electromagnetic field measuring method according to claim 11, wherein
- the optical component comprises a plane of polarization adjuster that adjusts a plane of polarization of the modulated light to a predetermined direction, and
- the amplitude level ratio control process comprises:
- a calculation control process of outputting an amplitude level control signal based on the spectrum of the electric signal measured by the spectrum measurement process, the amplitude level control signal being used to control the amplitude level of the carrier; and
- an amplitude level adjustment process of adjusting the amplitude level of the carrier by adjusting an angle with respect to a plane of polarization of the carrier based on the amplitude level control signal.

13. The electromagnetic field measuring method according to claim 11, wherein the amplitude level ratio control process comprises:
- a branch/pass process of causing a branched modulated light to branch from the modulated light incident through the optical component, and letting the signal light that is modulated by exposing to the electromagnetic field caused by the object to be measured to pass through;
- a calculation control process of outputting an amplitude level control signal based on the spectrum of the electric signal measured by the spectrum measurement process, the amplitude level control signal being used to control the amplitude level of the carrier;
- a control voltage generation process of generating a control voltage based on the amplitude level control signal; and
- a phase adjustment process of combining amplitude level adjustment modulated light obtained by modulating a phase of the branched modulated light based on the control voltage with the signal light that is modulated by exposing to the electromagnetic field caused by the object to be measured.

14. The electromagnetic field measuring method according to claim 11, wherein the amplitude level ratio control process comprises:
- a first branch process of generating branched modulated light by causing the modulated light incident through the optical component to branch, and emitting the branched modulated light;
- a calculation control process of outputting an amplitude level control signal based on the spectrum of the electric signal measured by the spectrum measurement process, the amplitude level control signal being used to control the amplitude level of the carrier;

a control voltage generation process of generating a control voltage based on the amplitude level control signal;

a phase adjustment process of generating amplitude level adjustment modulated light by adjusting a phase of the branched modulated light based on the control voltage, and emitting the amplitude level adjustment modulated light; and a light combining process of combining the amplitude level adjustment modulated light with the signal light that is modulated by exposing to the electromagnetic field caused by the object to be measured.

15. The electromagnetic field measuring method according to claim 11, wherein in the carrier signal light emitting process, a reference signal indicating a frequency, a phase, and an amplitude of the carrier signal light is output, and the amplitude level ratio control process comprises:

a calculation control process of outputting an amplitude level control signal based on the spectrum of the electric signal measured by the spectrum measurement process, the amplitude level control signal being used to control the amplitude level of the carrier;

an adjustment laser beam emitting process of emitting amplitude level adjustment laser beam having a same frequency and a same amplitude as those of the carrier signal light, and having a phase according to the amplitude level control signal, based on the reference signal; and a light combining process of combining the amplitude level adjustment laser beam with the signal light that is modulated by exposing to the electromagnetic field caused by the object to be measured.

16. The electromagnetic field measuring method according to claim 10, wherein in the amplitude level ratio control process, the amplitude level ratio between the carrier and the sideband is controlled to 4:1.

17. The electromagnetic field measuring method according to claim 10, wherein in the amplitude level ratio control process, the amplitude level ratio between the carrier and the sideband contained in the signal light incident through the optical component to a fixed value based on a spectrum corresponding to the local oscillation frequency and a frequency obtained by adding a radio frequency band of the electromagnetic field to that local oscillation frequency among spectrums of the electric signal measured in the spectrum measurement process, the signal light being modulated by exposing to the electromagnetic field caused by the object to be measured.

18. An electromagnetic field measuring apparatus comprising:

a laser light source that emits a laser beam having a predetermined frequency as a carrier signal light;

light modulation means for generating a modulated light by modulating the carrier signal light at a predetermined local oscillation frequency, and emitting the modulated light;

a certain optical component;

an electromagnetic field sensor that generates a signal light by exposing the modulated light incident through the optical component to an electromagnetic field of a radio frequency band caused by an object to be measured and thereby modulating the modulated light, and emits the signal light;

an optical receiver that receives the signal light from the electromagnetic field sensor through the optical component and outputs an electric signal having a same radio frequency band as the electromagnetic field;

a spectrum analyzer that measures a spectrum of the electric signal; and amplitude level ratio control means for controlling an amplitude level ratio between a carrier and a sideband contained in the signal light incident on the optical receiver to a fixed value based on the spectrum of the electric signal measured by the spectrum analyzer.

19. The electromagnetic field measuring apparatus according to claim 18, wherein the amplitude level ratio control means is configured to adjust an amplitude level of the carrier.

20. The electromagnetic field measuring apparatus according to claim 19, wherein the optical component comprises plane of polarization adjustment means for adjusting a plane of polarization of the modulated light emitted from the light modulation means to a predetermined direction, and the amplitude level ratio control means comprises:

a calculation control unit that outputs an amplitude level control signal based on the spectrum of the electric signal measured by the spectrum analyzer; and an analyzer that adjusts the amplitude level of the carrier by adjusting an angle with respect to a plane of polarization of the carrier based on the amplitude level control signal.

21. The electromagnetic field measuring apparatus according to claim 19, wherein the amplitude level ratio control means comprises:

an optical coupler that generates a branched modulated light by causing the modulated light incident on the electromagnetic field sensor to branch and emits the branched modulated light, and allowing the signal light emitted from the electromagnetic field sensor to pass therethrough;

a calculation control unit that outputs an amplitude level control signal based on the spectrum of the electric signal measured by the spectrum analyzer;

a voltage generator that generates a control voltage based on the amplitude level control signal; and a piezoelectric element that generates amplitude level adjustment modulated light by adjusting a phase of the branched modulated light emitted from the optical coupler based on the control voltage, and emits the amplitude level adjustment modulated light to the optical coupler and thereby combines the amplitude level adjustment modulated light with the signal light.

22. The electromagnetic field measuring apparatus according to claim 19, wherein the amplitude level ratio control means comprises:

a first optical coupler that generates a branched modulated light by causing the modulated light incident through the optical component to branch, and emits the branched modulated light;

a calculation control unit that outputs an amplitude level control signal based on the spectrum of the electric signal measured by the spectrum analyzer;

a voltage generator that generates a control voltage based on the amplitude level control signal;

a light modulation element that generates amplitude level adjustment modulated light by adjusting a phase of the branched modulated light emitted from the first optical coupler based on the control voltage, and emits the amplitude level adjustment modulated light; and a second optical coupler that combines the amplitude level adjustment modulated light emitted from the light modulation element with the signal light emitted from the electromagnetic field sensor.

23. The electromagnetic field measuring apparatus according to claim 19, wherein
the laser light source is configured to output a reference signal indicating a frequency, a phase, and an amplitude of the carrier signal light, and
the amplitude level ratio control means comprises:
a calculation control unit that outputs an amplitude level control signal based on the spectrum of the electric signal measured by the spectrum analyzer;
an amplitude level adjustment laser light source that emits an amplitude level adjustment laser beam having a same frequency and a same amplitude as those of the carrier signal light, and having a phase according to the amplitude level control signal, based on the reference signal; and
an optical coupler that combines the amplitude level adjustment laser beam with the signal light emitted from the electromagnetic field sensor.

24. The electromagnetic field measuring apparatus according to claim 18, wherein the amplitude level ratio control means is configured to control the amplitude level ratio between the carrier and the sideband to 4:1.

25. The electromagnetic field measuring apparatus according to claim 18, wherein the amplitude level ratio control means is configured to control the amplitude level ratio between the carrier and the sideband contained in the signal light incident on the optical receiver to a fixed value based on a spectrum corresponding to the local oscillation frequency and a frequency obtained by adding a radio frequency band of the electromagnetic field to that local oscillation frequency among spectrums of the electric signal measured by the spectrum analyzer.

26. A non-transitory computer readable medium storing an electromagnetic field measurement control program that causes a computer to control the amplitude level ratio control means according to claim 18.

* * * * *